United States Patent [19]

Kotowski

[11] Patent Number: 5,404,054
[45] Date of Patent: Apr. 4, 1995

[54] METHOD AND APPARATUS FOR CONTROLLING PROGRAMMABLE HYSTERESIS

[75] Inventor: Jeff Kotowski, Nevada City, Calif.
[73] Assignee: Silicon Systems, Inc., Tustin, Calif.
[21] Appl. No.: 925,994
[22] Filed: Aug. 6, 1992
[51] Int. Cl.6 .............................................. H03K 5/24
[52] U.S. Cl. ................................... 307/354; 307/290; 328/28
[58] Field of Search .................. 307/290, 354; 328/13, 328/28; 123/425, 435

[56] References Cited

U.S. PATENT DOCUMENTS

| | | | |
|---|---|---|---|
| 3,718,864 | 2/1973 | Kelly et al. | 307/290 X |
| 4,755,951 | 7/1988 | Hollister | 328/28 X |
| 4,800,500 | 1/1989 | Tanaka | 123/435 X |
| 4,926,068 | 5/1990 | Fujita | 307/290 X |

Primary Examiner—Willis R. Wolfe
Attorney, Agent, or Firm—Hecker & Harriman

[57] ABSTRACT

The present invention provides dynamic hysteresis for threshold detection circuitry. The hysteresis decay pattern, rate of decay, and minimum separation between the HSP and LSP are programmable. In particular, the hysteresis decay pattern may be programmed, in any manner, so that it has a better correlation to the amplitude of the input signal. The preferred embodiment of the present invention includes a comparator circuit, digital logic, and a digital-to-analog converter circuit. The comparator circuit has a fixed LSP and a programmable HSP for detecting threshold crossings of the input signal in order to accurately generate a pulse train. The HSP includes hysteresis for providing greater immunity to noise for an input signal having an amplitude which varies with frequency. The hysteresis of the HSP decays linearly at a programmable rate unlike prior art threshold detectors having a fixed rate of exponential decay determined by resistor and capacitor values. The magnitude of hysteresis decays until either the input signal crosses an intermediate HSP value or it reaches a last value and stops decreasing. Also, the minimum separation between the HSP and LSP is controlled by a digital-to-analog conversion circuit having digitally programmable levels. While the preferred embodiment provides a linearly decreasing hysteresis pattern, the digital logic of the present invention may be implemented with a memory device for storing programmable hysteresis patterns.

25 Claims, 13 Drawing Sheets

| | $O_0$ | $O_1$ | $O_2$ | $O_3$ | $O_4$ | $O_5$ | $O_6$ | $O_7$ | $O_8$ | $O_9$ | $O_{10}$ | $O_{11}$ | $O_{12}$ | $O_{13}$ | $O_{14}$ | $O_{15}$ |
|---|---|---|---|---|---|---|---|---|---|---|---|---|---|---|---|---|
| INITIAL STATE | 1 | 1 | 1 | 1 | 1 | 1 | 1 | 1 | 1 | 1 | 1 | 1 | 1 | 1 | 1 | 1 |
| 1ST CLOCK | 0 | 1 | 1 | 1 | 1 | 1 | 1 | 1 | 1 | 1 | 1 | 1 | 1 | 1 | 1 | 1 |
| 2ND CLOCK | 0 | 0 | 1 | 1 | 1 | 1 | 1 | 1 | 1 | 1 | 1 | 1 | 1 | 1 | 1 | 1 |
| ... | | | | | | | | | | | | | | | | |
| 15TH CLOCK | 0 | 0 | 0 | 0 | 0 | 0 | 0 | 0 | 0 | 0 | 0 | 0 | 0 | 0 | 0 | 1 |
| 16TH CLOCK | 0 | 0 | 0 | 0 | 0 | 0 | 0 | 0 | 0 | 0 | 0 | 0 | 0 | 0 | 0 | 0 |

FIG. 11

METHOD AND APPARATUS FOR CONTROLLING PROGRAMMABLE HYSTERESIS

BACKGROUND OF THE INVENTION

1. Field of the Invention

The present invention relates to the field of dynamic thresholds for threshold detectors.

2. Background Art

Threshold detection is a process whereby an input signal is compared to a predetermined value, hereinafter referred to as a threshold level, to determine if the input signal is higher or lower than the predetermined value. The threshold level may be considered a dividing line whereby an input signal is considered either logic level HIGH if it is equal to or above the threshold level or logic level LOW otherwise. A threshold detector is a device that implements this function and commonly comprises a comparator. It compares an input signal with a threshold level and outputs either a HIGH or LOW as stated above.

FIG. 1A illustrates an input signal, in this case a sinusoidal tone, crossing a constant threshold level $V_R$. The output signal of a threshold detector detecting the input signal of FIG. 1A is illustrated in FIG. 1D. Prior to time $t_1$, the input signal is lower than $V_R$, thus, the output signal is LOW. However, at time $t_1$, the input signal exceeds $V_R$ and remains above $V_R$ until time $t_2$. The output signal of threshold detector shown in FIG. 1D correspondingly becomes HIGH at time $t_1$ and remains HIGH until time $t_2$. At time $t_2$, the input signal decreases below $V_R$, therefore, the output signal becomes LOW. Similar transitions in the output signal due to the input signal occur at times $t_3$ and $t_4$. In this manner, a pulse train having HIGH and LOW logic levels is produced by the threshold detector according to the input signal.

Threshold detection is used in many applications. For instance, heating systems often include a thermostat for maintaining a constant temperature. Such a heating system includes a threshold detector for determining when a temperature dependent input signal exceeds the threshold level set using the thermostat. When the temperature dependent input signal is below the threshold level, the heating system remains on. However, once it exceeds the threshold level, the heating system turns off.

Input signals often include noise (due to external noise sources, temperature variations, etc.). As a result of such noise, a "false" threshold crossing may occur causing the threshold detector to erroneously output an incorrect logic level. In order to increase the immunity to noise of the threshold detector, the threshold level can be adjusted dependent upon the input signal level and on the output of the threshold detector in order to prevent erroneous threshold crossings. This effect is commonly referred to as hysteresis.

For example, an input signal including noise is shown in FIG. 1B, however, this input signal includes noise. In FIG. 1B, a constant threshold level, $V_R$, is indicated having a solid line. The drawing illustrates extra false threshold crossings after time $t_2$ because noise in the input signal causes it to cross $V_R$ at times $t_3$ and $t_4$. The false threshold crossings due to noise produce an output signal which is illustrated in FIG. 1E. This output signal includes an extra pulses of short duration between times $t_3$ and $t_4$, thereby, differing from that of FIG. 1D due to noise.

Hysteresis provides greater immunity to noise of an input signal for threshold detection. By including hysteresis in the threshold detector, errors in the output signal can be reduced or removed completely. Hysteresis is illustrated in FIG. 1C. Instead of having a single threshold level, such as $V_R$, a threshold detector including hysteresis has two or more threshold levels.

A high and low threshold level $V_{TH}(HI)$ and $V_{TH}(LO)$ are plotted in FIG. 1C as an upper and lower solid line, respectively. The voltage difference, $V_{TH}(HI)-V_{TH}(LO)$, is the hysteresis magnitude. The threshold detector does not produce errors in the output signal if the amplitude of noise in the input signal is less than the hysteresis magnitude. Referring to the drawing of FIG. 1C, the input signal increases positively crossing $V_{TH}(HI)$ at time $t_1$ causing the output signal of the threshold detector to change from LOW to HIGH. The output signal of the threshold detector remains HIGH even though the input signal decreases below $V_{TH}(HI)$. The output signal of the threshold detector changes to a logic level LOW only when the input signal decreases below $V_{TH}(LO)$ at time $t_2$. Similarly, the output signal remains LOW until the input signal crosses $V_{TH}(HI)$ regardless of subsequent crossings of $V_{TH}(LO)$ due to noise.

An output signal of the threshold detector having hysteresis, as described above, is illustrated in FIG. 1F according to the input signal and hysteresis of FIG. 1C. By comparing FIG. 1F to FIG. 1E, it can be seen that the output signal of the threshold detector does not include erroneous transitions if the hysteresis magnitude is greater than the amplitude of noise in the input signal. Therefore, hysteresis provides the desirable effect of greater immunity to noise for threshold detection.

Often, hysteresis threshold detecting systems employ fixed upper and lower threshold levels. There are certain applications where fixed levels can lead to erroneous output. For example, electronic ignitions for combustion engines operating at various speeds may require the detection of an input signal having a frequency and an amplitude that varies according to the speed of a rotating engine component. This signal is applied to a threshold detector in order to produce a binary pulse train having transitions according to the input signal. At lower engine speeds, the input signal has lower amplitude and lower frequency. At higher engine speeds, the input signal is higher in amplitude and frequency.

At higher engine speeds, the input signal also includes higher noise levels. The noise is generated by such sources as engine vibrations and is generally a function of frequency, thereby, increasing to higher amplitude levels at higher input frequencies. Also, an input signal can have noise which is time dependent occurring in a certain portion of the input signal period. Erroneous threshold crossings can result in improper engine operation, therefore, accurate threshold crossing detection is desired.

Two important considerations for specifying hysteresis are the amplitude range of input signals and the amount of noise in the input signal. Input signals that are smaller in peak-to-peak amplitude than the magnitude of hysteresis cannot be detected properly. Therefore, a tradeoff exists between the range of input signals that can be detected and the magnitude of hysteresis required to prevent erroneous threshold crossings due to noise. As stated above, the noise of an input signal generally increases with frequency. Therefore, it is desirable to provide a greater magnitude of hysteresis for higher amplitude, higher frequency input signals than for lower amplitude, lower frequency input signals.

Three input signals are illustrated in FIG. 2 for a threshold detector having two fixed threshold levels. Hereinafter, the upper threshold level is referred to as the high switchpoint (HSP) and the lower threshold level is the low switchpoint (LSP). The input signal illustrated in FIG. 2A is a low amplitude, low frequency signal. The separation between the HSP and LSP is greater than the peak-to-peak amplitude of the input signal, thus, the input signal does not cross the HSP and LSP. Therefore, the threshold detector is not able to properly detect the input signal due to the separation between the HSP and LSP.

An input signal having nominal amplitude and frequency values is shown in FIG. 2B. For such input signals having noise levels smaller than the separation between the HSP and LSP, the threshold detector is able to accurately detect threshold crossings of the input signal. However, for input signals with larger amplitudes at higher frequencies, there can be significantly more noise in the input signal. Such an input signal is illustrated in FIG. 2C where the separation between the HSP and LSP is not sufficient to prevent an erroneous threshold crossing due to noise at time $t_1$.

For input signals having amplitudes that vary with frequency, time dependent hysteresis may provide greater immunity to noise for threshold detection. In time dependent hysteresis, the magnitude of hysteresis is variable having a range of threshold values which an input signal may cross according to the period of the input signal. The purpose of time dependent hysteresis is to detect an input signal without false threshold crossings even though the amplitude and noise of the input signal varies with the frequency of the input signal.

A prior art circuit for threshold detection having time and frequency dependent hysteresis is shown in FIG. 3. An input signal 330 is provided to the inverting input of amplifier 320 and is compared to a threshold level at a non-inverting input of amplifier 320. An output signal 340 is coupled to the non-inverting input of amplifier 320 by capacitor 360 and a resistor 350 is coupled between the non-inverting input and ground.

An input signal 330 is shown in FIG. 4A and a threshold signal having hysteresis according to the prior art circuit of FIG. 3 is illustrated in FIG. 4B. During the first cycle of the input signal, the magnitude of hysteresis is largest at times 0 and $t_1$. At time 0, the input signal 330 causes amplifier 320 to go into negative saturation producing a negative threshold voltage across resistor 330. As capacitor 360 charges, the magnitude of hysteresis decays exponentially so that the threshold voltage increases toward its steady-state level of 0V. Similarly, at time $t_1$, the input signal 330 decreases below the threshold voltage causing amplifier 320 to go into positive saturation, thereby producing a positive threshold voltage across resistor 330. FIG. 4B illustrates that the threshold voltage provides the largest immunity to noise at times 0 and $t_1$ during the first cycle of the input signal, and provides less immunity to noise as the magnitude of hysteresis decreases exponentially. The rate of hysteresis decay of this prior art circuit is fixed due to capacitor 360 and resistor 350.

A second prior art threshold detector provides time and frequency dependent hysteresis similar to the prior art circuit described above having hysteresis decay that is determined by resistor and capacitor values. However, this prior art circuit provides feedback to the input node of the threshold detector so that the upper threshold level of hysteresis is pulled up to a higher voltage, thereby, further increasing the magnitude of hysteresis immediately after a threshold crossing. This device has the effect that the threshold detector blanks out portions of the input signal which cannot be detected for a period of time although a valid threshold crossing can occur.

There are several disadvantages to the prior art. One disadvantage is that the hysteresis pattern decreases according to analog resistor and capacitor values requiring large values to provide large time constants.

Another problem is that it is difficult to produce accurate analog resistor and capacitor values. Inaccurate analog resistor and capacitor values can generate inconsistent time constants for controlling threshold voltage hysteresis.

A further problem is that the hysteresis pattern often does not have any relationship to the input signal. The amplitude of the input signal may not be an exponential function of frequency. The RC circuit of the prior art locks the hysteresis into an exponentially decaying function regardless of how the amplitude of the input signal varies. Thus, the hysteresis may have no relationship to the input signal. Hysteresis may be required which changes linearly, logarithmically, or as a specially adapted function of the input signal.

Yet another disadvantage is that the time constant for the exponentially decaying hysteresis is not easily programmable due to the analog resistor and capacitor components.

A further disadvantage is that it provides little or no immunity to noise for transients that occur well after the hysteresis transition to its maximum value.

Finally, another disadvantage of the prior art is that blanking of the input signal to minimize false triggers eliminates the ability to detect a true input signal crossing during the blanking interval.

A third prior art threshold detector comprises a microprocessor circuit which measures the frequency of an input signal and then adjusts the magnitude of hysteresis by adjusting resistance values. This method has the disadvantage of being an after-the-fact method since it must first measure the input signal before changing the magnitude of hysteresis. Therefore, the hysteresis does not respond immediately to changes in the input signal frequency.

SUMMARY OF THE PRESENT INVENTION

The present invention provides dynamic hysteresis for threshold detection circuitry. The hysteresis decay pattern, rate of decay, and minimum separation between the HSP and LSP are programmable. The hysteresis decay pattern may be programmed, in any manner, so that it has a better correlation to the amplitude of the input signal.

In the preferred embodiment of the present invention, a threshold detector is provided with programmable hysteresis. The device includes a comparator circuit, digital logic, and a digital-to-analog converter circuit. The comparator circuit has a fixed LSP and a programmable HSP for detecting threshold crossings of the input signal in order to accurately generate a pulse train. It compares the input signal to the switchpoints and generates either a LOW or a HIGH when the input signal goes below the LSP or exceeds the HSP, respectively. When the amplitude of the input signal is between the HSP and LSP, the output signal remains at its previous value.

While the LSP is fixed, the HSP includes hysteresis for providing greater immunity to noise for an input signal having an amplitude that varies with frequency. The hysteresis of the HSP decays linearly at a programmable rate unlike prior art threshold detectors having a fixed rate of exponential decay determined by resistor and capacitor values. The magnitude of hysteresis decays until either the input signal crosses an intermediate HSP value or it reaches a last value and stops decreasing. Therefore, the hysteresis level of the HSP that an input signal crosses is a function of the frequency of the input signal. Also, the minimum separation between the HSP and LSP is controlled by a digital-to-analog conversion circuit having digitally programmable levels.

While the preferred embodiment provides a linearly decreasing hysteresis pattern, the digital logic of the present invention may be implemented with a memory device for storing hysteresis patterns and thereby providing a decay pattern that is programmable.

BRIEF DESCRIPTION OF THE DRAWINGS

FIG. 11 is a table illustrating digital values output by shift register 752 of FIG. 7 during each clock interval.

DETAILED DESCRIPTION OF THE PRESENT INVENTION

A threshold crossing detector having digitally controlled time and frequency hysteresis is described. In the following description, numerous specific details, such as number and nature of external signals, threshold levels, comparators, flip-flops, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

The present invention provides a hysteresis decay pattern, rate of decay, and minimum separation between the HSP and LSP that are digitally controlled and therefore are programmable. It has a fixed LSP and a HSP having hysteresis for accurately detecting threshold crossings of an input signal in order to generate a pulse train. It compares the input signal to the switch-points and generates either a LOW or a HIGH when the input signal goes below the LSP or exceeds the HSP, respectively. The output signal remains at its previous value when the amplitude of the input signal is between the HSP and LSP.

When the output signal of the present invention is HIGH, the HSP is set to its maximum value. Once the input signal crosses the LSP, the output signal changes from HIGH to LOW. Accordingly, the voltage level of the HSP begins to decrease linearly at a rate determined by a reference frequency and a first digital value. The HSP decays until either the input signal crosses an intermediate HSP value or the HSP reaches a last value and stops decreasing. Therefore, the level of the HSP which an input signal crosses is a function of the frequency of the input signal.

The minimum separation between the HSP and LSP is controlled by a second digital value. This minimum separation has several incremental levels which can be adjusted digitally in order to vary the minimum separation between the HSP and LSP.

Figure 6:
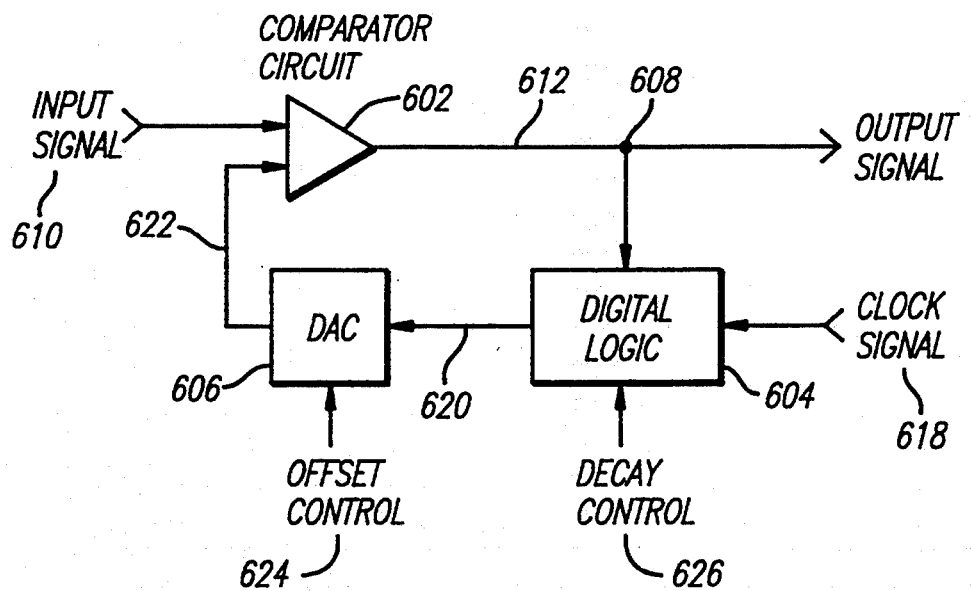
FIG. 6 is a block diagram illustrating the present invention.

A block diagram of the present invention shown in FIG. 6 includes comparator circuit 602, digital logic 604, and digital-to-analog converter (DAC) 606. An input signal 610 is provided to comparator circuit 602. The output 612 of comparator circuit 602 is coupled to node 608. Node 608 is coupled to digital logic 604 and provides the output signal 612 of comparator circuit 602 to external circuitry. A clock signal 618 and a decay control signal 626 are provided to digital logic 604. The output 620 of digital logic 604 is coupled to DAC 606. Also, an offset control signal 624 is provided to DAC 606. The output 622 of DAC 606 is coupled to comparator circuit 602.

Comparator circuit 602 determines when the amplitude of an input signal 610 crosses a HSP and LSP. It generates a binary signal at its output 612 having transitions corresponding to HSP and LSP crossings of the input signal 610. The voltage level of the HSP provided to comparator circuit 602 is determined by the output 622 of DAC 606 which is controlled by digital logic 604. Digital logic 604 can be programmed in hardware or in integrated form comprising hardware and software. Digital logic 604 sets the output 622 of DAC 606 based upon a function dependent on the output level 612 of comparator circuit 602, the periodic frequency of input signal 610 provided to comparator circuit 602, and the elapsed time between triggering events.

Further, when the output 612 of comparator circuit 602 is HIGH, digital logic 604 provides an initial digital value on its output 620. As long as the output 612 of comparator 602 remains HIGH, digital logic 604 continues to provide the initial digital value on its output 620. The initial digital value on output 620 causes DAC 606 to produce a maximum voltage level for the HSP on its output 622. When input signal 610 crosses the LSP causing the output 612 of comparator 602 to become LOW, digital logic 604 provides digital values on output 620 that change at a rate determined by decay control signal 626 and clock signal 618.

DAC 606 generates an HSP on its output 622 according to the digital values provided on output 620 of digital logic 604. If input signal 610 crosses an intermediate HSP value, the HSP is reset to the maximum value again. However, if the time between consecutive valid HSP crossings is much larger than the time required to step through the digital values output by digital logic 604, digital logic 604 stops at a last digital value provided on output 620, thereby, causing DAC 606 to output a last HSP value. Digital logic 604 continues to provide this last digital value on output 620 until input signal 610 crosses the HSP. The minimum offset level for the HSP provided on output 622 by DAC 606 is controlled by offset control signal 624, thereby, digitally controlling the minimum separation between the HSP and LSP.

Figure 9:
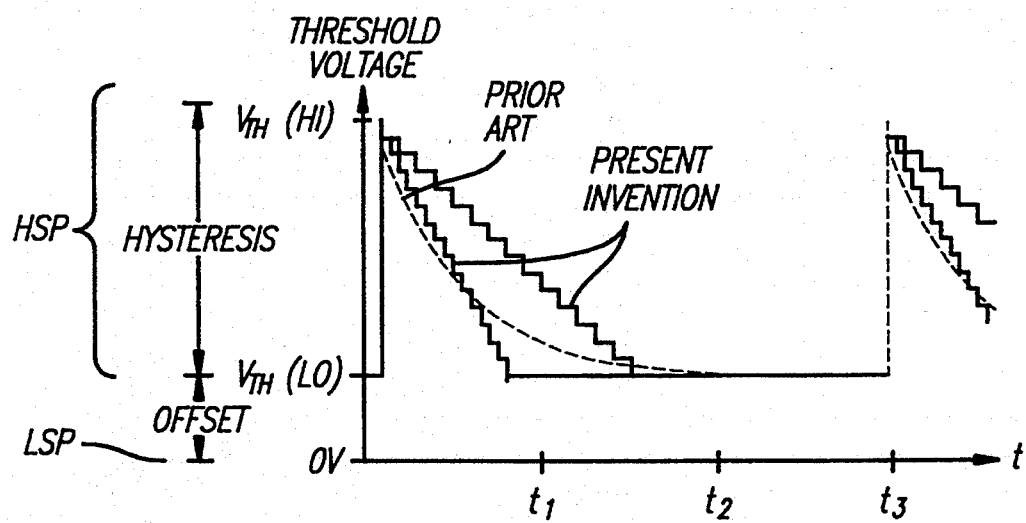
FIG. 9 is a diagram comparing the linear hysteresis pattern and programmable rate of decay of the present invention to the prior art.

Threshold voltages having hysteresis according to the present invention and a prior art example are illustrated in FIG. 9. The diagram shows a hysteresis signal according to the present invention having two different decay rates that are digitally controllable, whereas, the prior art hysteresis indicated by a dashed line decreases exponentially from $V_{TH}(HI)$ to $V_{TH}(LO)$ according to a fixed time constant determined by analog resistor and capacitor values. The first hysteresis pattern of the present invention decreases more rapidly to $V_{TH}(LO)$ since the clock rate governing it is greater than that of the second hysteresis pattern. Also, the offset level of $V_{TH}(LO)$ is digitally selectable. Adjusting the offset level shifts the magnitude of hysteresis up or down but does not affect the magnitude of hysteresis.

Figure 7:
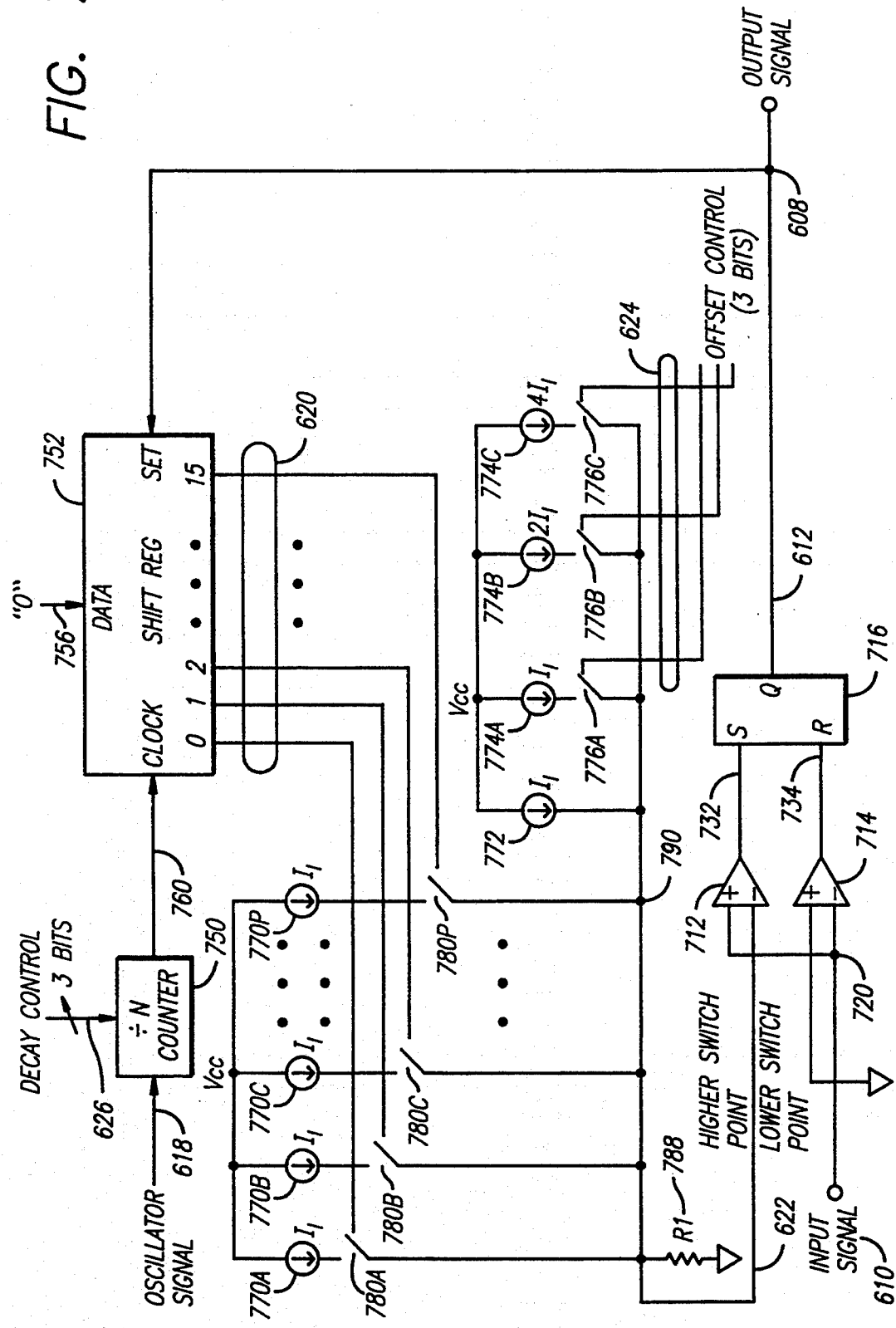
FIG. 7 is a detailed schematic of the preferred embodiment of the present invention.

The preferred embodiment of the present invention is illustrated in detail in FIG. 7. Comparator circuit 602 includes comparators 712 and 714, and flip-flop 716. Digital logic 604 includes divide-by-N counter 750 and shift register 752. DAC 606 includes switches 780A-780P, current sources 770A-770P, and resistor 788. Although shift register 752 has an output 620 specified as sixteen bits to DAC 606, the present invention can be implemented with elements having different bit capacities.

An input signal 610 is provided to node 720. Node 720 is coupled to the non-inverting input terminal of comparator 712 and to the inverting input terminal of comparator 714. The non-inverting input terminal of comparator 714 is coupled to ground. The output 734 of comparator 714 is coupled to the R input terminal of flip-flop 716. The inverting input terminal of comparator 712 is coupled to node 790. The output 732 of comparator 712 is coupled to the S input of flip-flop 716. The output 612 of flip-flop 716 is coupled to node 608.

An output signal of flip-flop 716 is provided at node 608. Node 608 is coupled to shift register 752. The output 760 of divide-by-N counter 750 is coupled to shift register 752. Decay control signal 626 comprising three bits is provided to divide-by-N counter 750. Oscillator signal 618 is provided to divide-by-N counter 750.

A constant digital value of zero 756 is provided to the data input of shift register 752. The output 620 of shift register 752 comprising 16 bits 620A-620P is coupled to sixteen switches 780A-780P. In particular, output bit 0 620A of shift register 752 is coupled to switch 780A. Similarly, output bits 1-15 620B-620P of shift register 752 are coupled to corresponding switches 780B-780P. Switches 780A-780P may be implemented with NMOS field effect transistors (FET), not shown in FIG. 7, with each transistor having its gate coupled to an output bit 620A-620P of shift register 752.

Switch 780A is coupled between node 790 and current source 770A. Current source 770A is coupled to $V_{cc}$. Similarly, switches 780B-780P are coupled between node 790 and current sources 770B-770P respectively. Current sources 770B-770P are coupled to $V_{cc}$. The amplitudes of current sources 770A-770P are equal with each having a constant level $I_1$.

Current source 772, having a constant amplitude $I_1$, is coupled between node 790 and $V_{cc}$. An offset control signal 624 comprising three bits 0-2 624A-624C is provided to switches 776A-776C. Switches 776A-776C may be implemented with NMOS FETs, not shown in FIG. 7, with each transistor having its gate coupled respectively to an offset control bit 0-2 624A-624C. Switch 776A is coupled between node 790 and current source 774A. Current source 774A is coupled to $V_{cc}$. Similarly, switches 776B and 776C are coupled between node 790 and current sources 774B and 774C respectively. Current sources 774B and 774C are coupled to $V_{cc}$. The amplitudes of current sources 774A-774C are base-two multiples of amplitude $I_1$ having a ratio of 1, 2 and 4 respectively. A resistor 788 is coupled between node 790 and ground.

The threshold voltage $V_{TH}$ at node 790 is the HSP having time and frequency dependent hysteresis. It has a minimum value determined by resistor 778 having a resistance value $R_1$, current source 772 and the state of switches 776A-776C. Switches 776A-776C connect current sources 774A-774C to resistor 778 according to the value of the offset control signal 624 applied to switches 776A-776C. In this manner, an offset voltage is generated having a fixed value ranging from $I_1R_1$ to 8 $I_1R_1$. The LSP is ground according to FIG. 7 since the non-inverting terminal of comparator 714 is coupled to ground.

The operation of the present invention is described with reference to the input signal of FIG. 10B where for purposes of illustration a fixed HSP and LSP are shown. Initially, the threshold voltage HSP is at a minimum voltage level as shown in FIG. 10E that is set by an offset control signal 624 and the output 612 of flip-flop 716 is LOW.

At time $t_1$, the amplitude of input signal 610 crosses the minimum threshold voltage $V_{TH}(LO)$ of the HSP. The output 732 of comparator 712 becomes HIGH while the output 734 of comparator 714 remains LOW. Therefore, the S- and R-input terminals of flip-flop 716 are HIGH and LOW, respectively, forcing a state transition in output 612 from LOW to HIGH. Thus, the output signal 612 at node 608 sets shift register 752 by placing a HIGH on the set input of shift register 752. It continues to set shift register 752 until the output 612 of flip-flop 716 changes to LOW.

While the set input of shift register 752 remains HIGH, shift register 752 places HIGHs on output bits 0–15 620A–620P, thereby, closing switches 780A–780P and connecting current sources 770A–770P to resistor 788. Connecting current sources 770A–770P to resistor 788 generates a maximum threshold voltage $V_{TH}(HI)$ for the HSP. Hysteresis of the HSP is the range of voltages between $V_{TH}(HI)$ and $V_{TH}(LO)$. The maximum value of threshold voltage $V_{TH}(HI)$ causes the output 732 of comparator 712 to switch to a LOW state because the HSP now exceeds the amplitude of input signal 610. However, the output 612 of flip-flop 716 remains HIGH and is not affected by subsequent HSP crossings until a LSP crossing occurs. Thus, the HSP is kept at a maximum threshold voltage value $V_{TH}(HI)$.

The amplitude of input signal 610 at node 720 crosses the LSP of comparator 714 at time $t_2$. Comparator 714 outputs a HIGH to the R-input of flip-flop 716 forcing a transition to LOW in output 612 of flip-flop 716. The output signal 612 at node 608 ceases to reset shift register 752 which begins shifting zeroes into output 620 shown in FIG. 11 at a rate determined by divide-by-N counter 750 and oscillator signal 618. Thus, the threshold voltage $V_{TH}$ of the HSP decreases linearly as switches 780A–780P sequentially disconnect current sources 770A–770P from resistor 788. Further crossings of the LSP by input signal 610 do not produce a change in the output 612 of flip-flop 716 until a threshold crossing of the HSP occurs.

Figure 12:
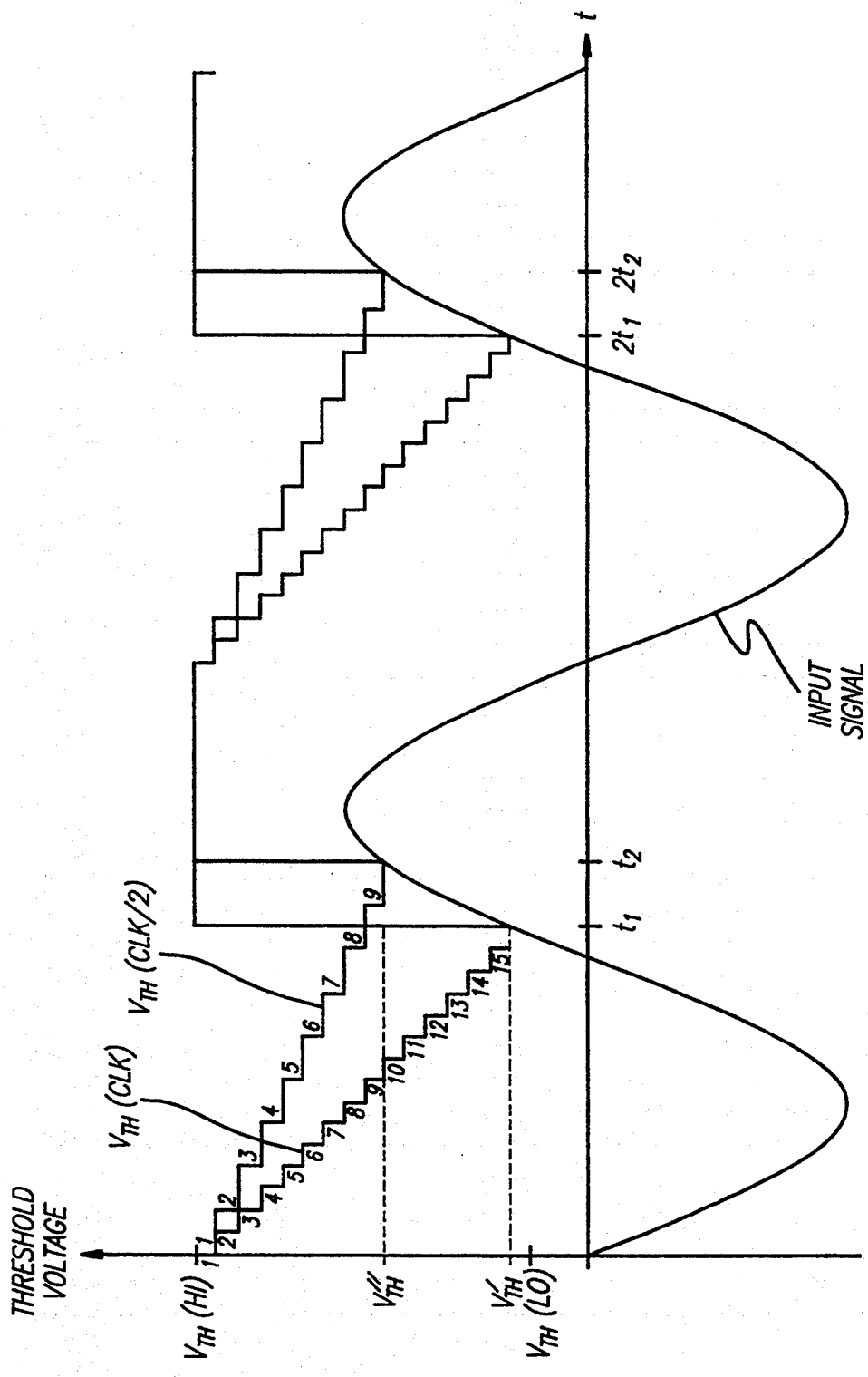
FIG. 12 is a diagram illustrating threshold crossings of an input signal having a constant frequency for hysteresis decaying at two different rates.

FIG. 10E illustrates the HSP having time and frequency dependent hysteresis and the LSP of the present invention. The drawing demonstrates the linear decay of the HSP. Further, hysteresis of the present invention is shown in FIG. 12 to be dependent upon the output 760 of divide-by-N counter 750 applied to shift register 752, thereby demonstrating an advantage of the present invention over the prior art in that the hysteresis decay rate can be changed digitally. For a given oscillator signal 618, the duration of threshold voltage levels is digitally controlled by divide-by-N counter 750 thereby controlling the HSP that an input signal 610 must cross at a given frequency of input signal 610.

In particular, FIG. 12 illustrates the effect of increasing the threshold voltage duration by dividing the frequency of oscillator signal 618, $f_{clk}$, by 2. In the first instance, the threshold voltage decreases in 15 increments having durations determined by $f_{clk}$ to an amplitude of $V_{TH}'$. Thus, input signal 610 crosses the HSP at time $t_1$. Digitally changing the divide-by-N counter 750 to clock shift register 752 at half the previous rate, $f_{clk} \div 2$, doubles the threshold voltage duration. The threshold voltage decreases in 9 increments to $V_{TH}''$, where $V_{TH}'' > V_{TH}'$, before an input signal 610 crosses the new HSP at time $t_2$, where $t_1 < t_2$. Thus, increasing the threshold voltage duration increases the threshold voltage level that input signal 610 having a given frequency must CROSS.

As the frequency of input signal 610 changes, a corresponding change in the crossing of the threshold voltage $V_{TH}$ having a fixed duration occurs. If input signal 610 decreases in frequency, the HSP decreases toward its minimum value before input signal 610 crosses a threshold voltage level. Similarly, if input signal 610 increases in frequency, HSP crossings occur at higher threshold voltage levels.

In the prior art, the hysteresis of threshold detectors has been implemented with a fixed minimum separation between the HSP and LSP designed for nominal threshold voltages. If the input signal amplitude is lower than the minimum separation between the HSP and LSP, the threshold detector does not properly detect the input signal. However, in the present invention, the minimum separation between the HSP and LSP can be adjusted digitally. The offset control signal 624 specifies eight possible minimum threshold voltage levels for $V_{TH}(LO)$ thereby providing a means to digitally control the separation between the HSP and LSP. This results in a corresponding likelihood of accurately detecting smaller input signals.

Figure 10A:
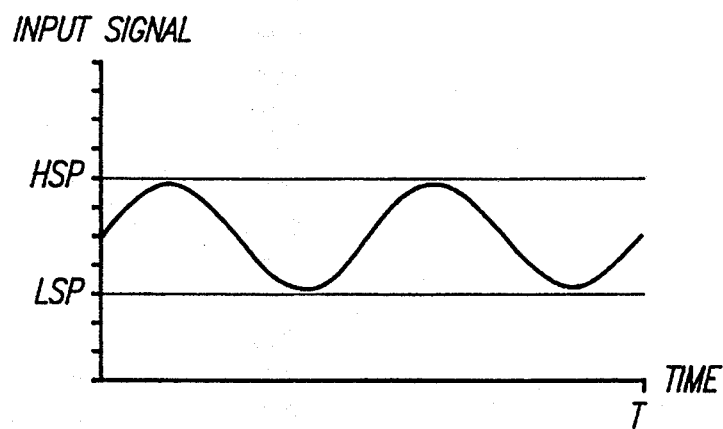
FIGS. 10A–10F are relative timing diagrams illustrating the relationship between threshold decay of the HSP having time and frequency dependent hysteresis and input signals having amplitudes and noise that increase with frequency.
Figure 10B:
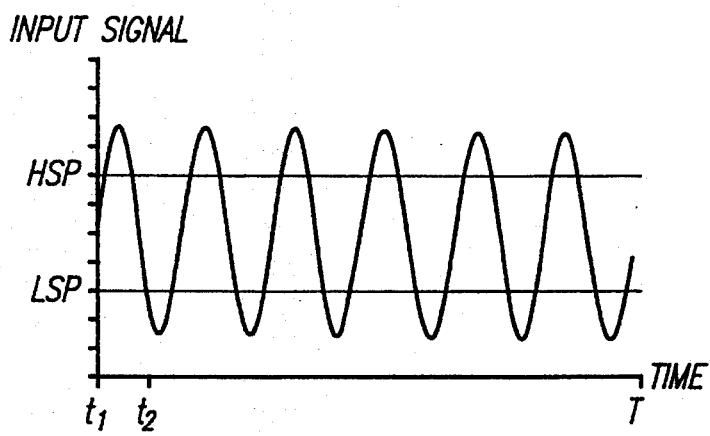
Figure 10C:
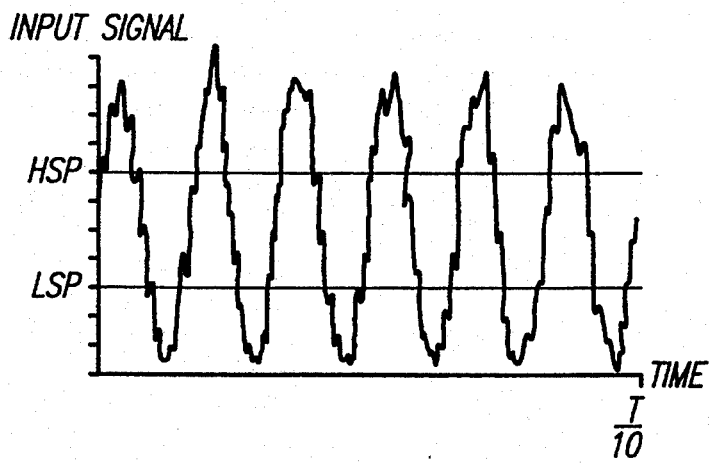
Figure 10D:
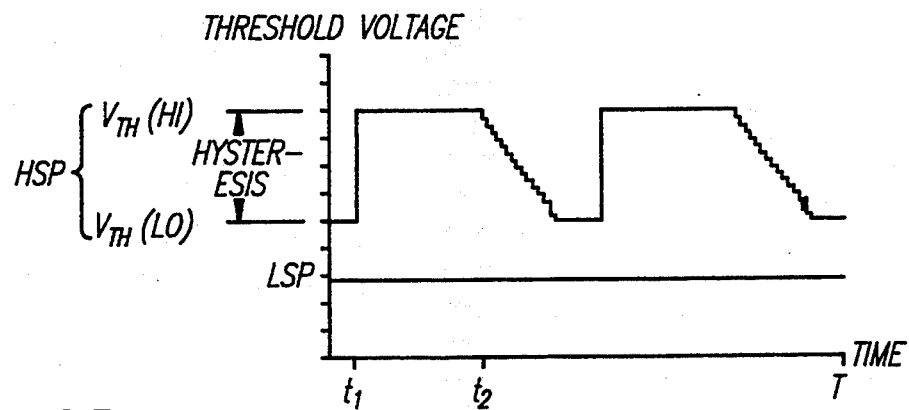
Figure 10E:
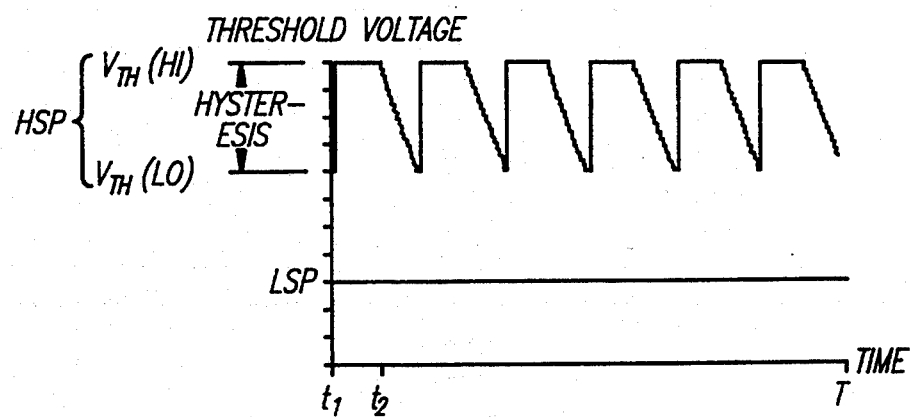

A threshold voltage pattern according to the present invention is illustrated in FIG. 10D for an input signal having low amplitude and low frequency shown in FIG. 10A. A threshold crossing of the HSP occurs in the present invention because the offset voltage $V_{TH}(LO)$ can be digitally adjusted. The prior art cannot detect this input signal due to fixed separation between the HSP and LSP. Thus, the present invention is able to accurately detect low amplitude input signals which the prior art cannot. While the present invention provides eight minimum threshold voltage levels and sixteen voltage levels for hysteresis, it should be apparent to one skilled in the art that the range and resolution of threshold voltage levels can be adjusted by changing the number and amplitude of current sources and correspondingly the value and number of output bits for shift register 752 and the offset control code.

Figure 10F:
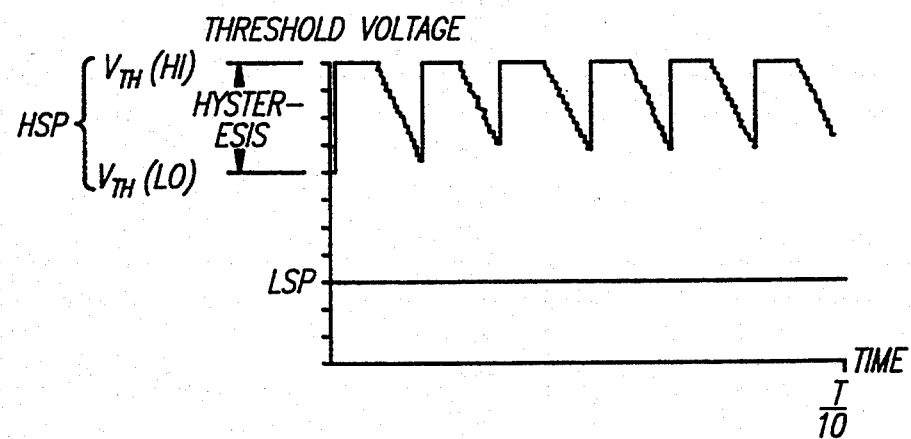

An input signal having higher amplitude and frequency is shown in FIG. 10C. The hysteresis rate of decay for the present invention is digitally increased to accurately detect threshold crossings of the HSP, whereas the rate of hysteresis decay in the prior art remains fixed. The hysteresis rate of decay for the present invention is illustrated in FIG. 10F. The present invention is able to accurately detect the higher frequency input signal of FIG. 10C since the hysteresis rate of decay can be controlled by divide-by-N counter 750. The fixed exponential decay of prior art methods decreases at rates that are slow compared to the frequency of such input signals and therefore do not accurately detect the input signal. The diagram shows that the present invention can detect each cycle of the input signal.

Figure 13A:
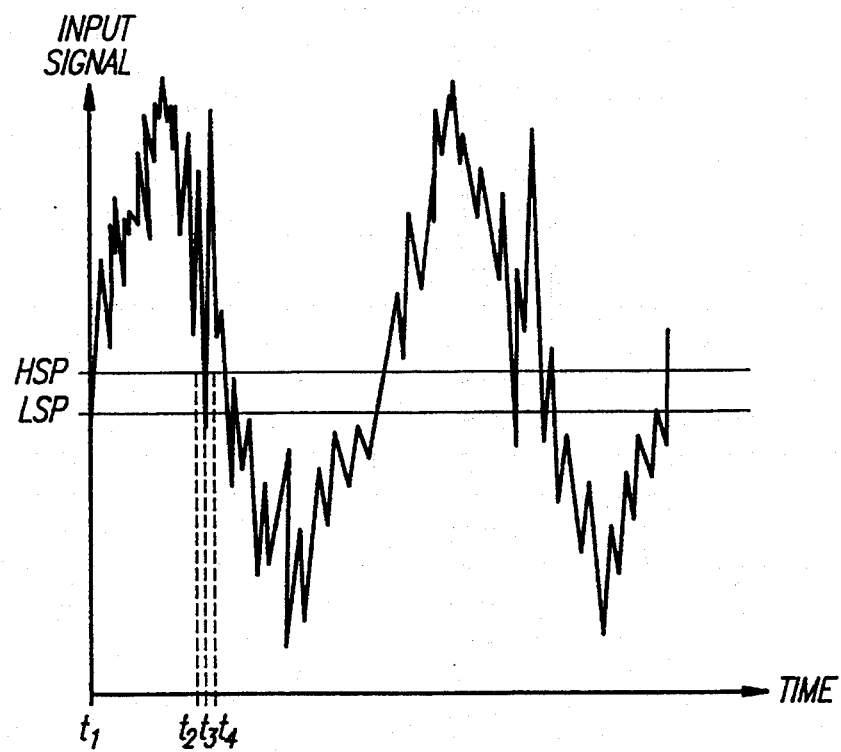
FIGS. 13A–13B are diagrams illustrating the advantage of digitally-controllable hysteresis rates of decay for the present invention compared to the fixed hysteresis rate of decay of the prior art in preventing false threshold crossings.
Figure 13B:
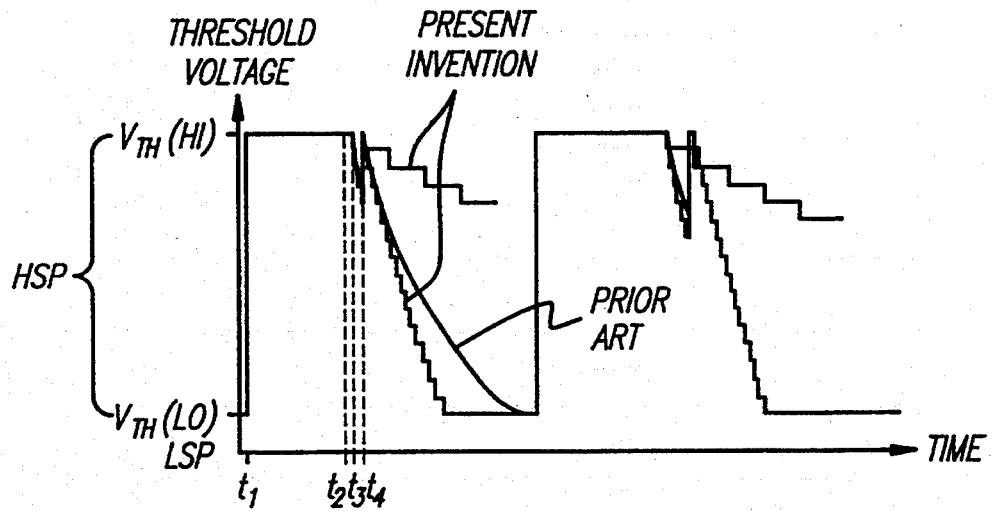

An increase of noise in the input signal typically occurs at higher input signal frequencies. Noise can generate extra threshold crossings of the input signal resulting in an erroneous output signal at node 608. An input signal containing noise is illustrated in FIG. 13A. The hysteresis rate of decay of the present invention can be digitally controlled in order to prevent erroneous threshold crossings whereas the prior art cannot. The threshold voltage patterns for the present invention and prior art are illustrated in FIG. 13B. The diagram demonstrates that the hysteresis rate of decay of the present invention can be adjusted to prevent erroneous threshold crossings. Because the decay rate of the prior art is fixed, errors occur in the output signal due to the erroneous threshold crossings at times $t_3$ and $t_4$.

Figure 8:
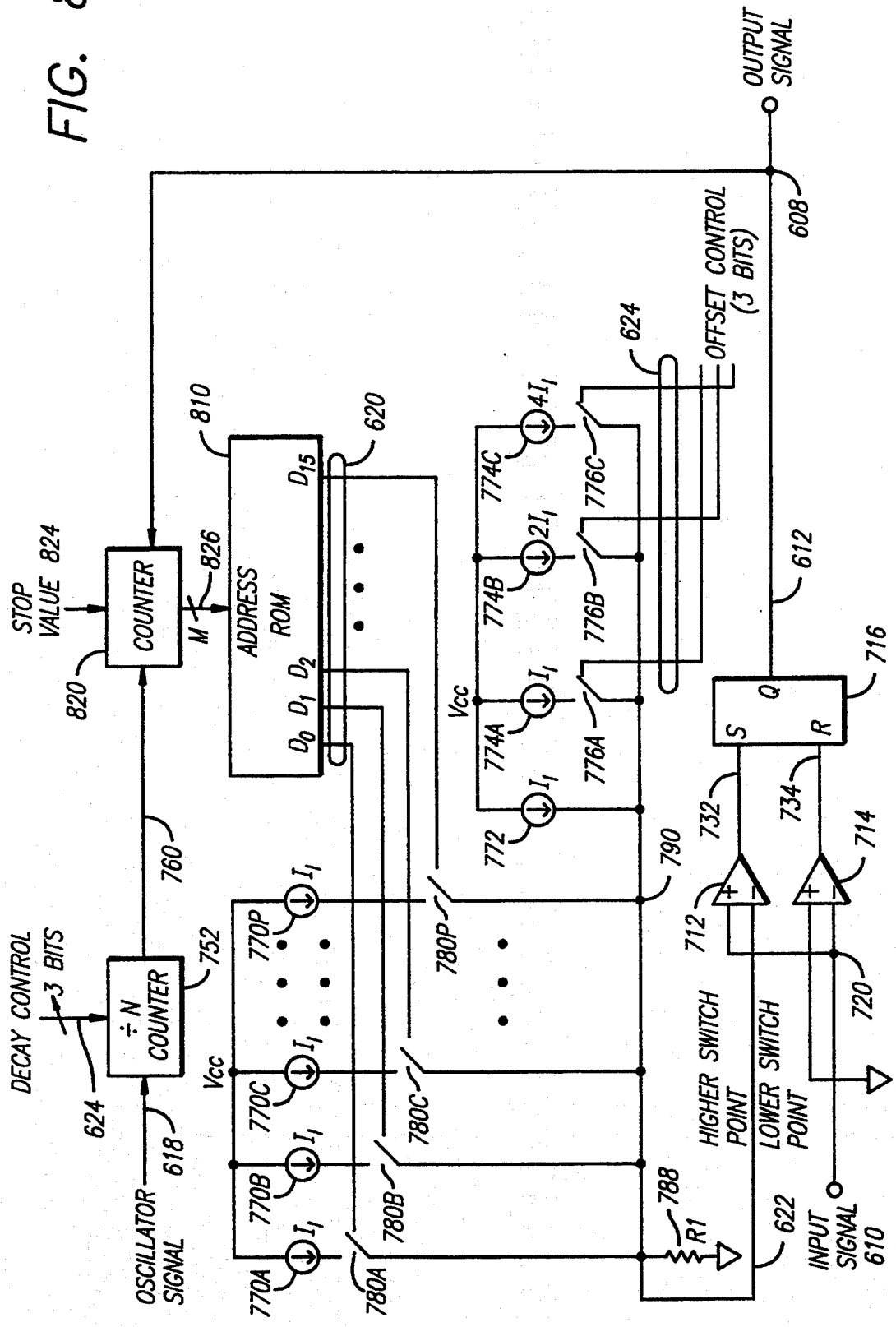
FIG. 8 is a detailed schematic of an alternate embodiment of the present invention.

An alternate embodiment having digitally controlled time and frequency hysteresis is illustrated in FIG. 8. This embodiment is substantially the same as that shown in FIG. 7 except for the replacement of shift register 752 by read only memory (ROM) 810 and counter 820. In this configuration the output 760 of divide-by-N counter 750 is coupled to the clock input of counter 820. Node 608 is coupled to the reset input of counter 820. A stop value 824 is provided to counter 820. The output 826 of counter 820 comprising M bits is coupled to the address inputs of ROM 810. The output of memory 810 comprising sixteen data bits 620A–620P is coupled to switches 780A–780P.

As in the preferred embodiment, the duration of each threshold voltage level of the HSP is digitally controlled by divide-by-N counter 750 thereby controlling the decay rate of time and frequency dependent hysteresis. Similarly, the threshold voltage level at which the input signal crosses the HSP is dependent upon the frequency of the input signal. However, the threshold voltage pattern of hysteresis is not restricted to a pattern which either decreases either exponentially or linearly. The hysteresis pattern of the threshold voltage for the HSP is specified by the data stored in ROM 810. A threshold voltage sequence can be generated with software according to any pattern and stored in ROM 810. The threshold voltage pattern can be designed to account for noise in the input signal which is known a priori.

Operation of the circuit is substantially the same as in the preferred embodiment. When the input signal crosses the HSP, comparator 712 causes a state transition from LOW to HIGH in the output 612 of flip-flop 716. The output signal at node 608 resets counter 820 thereby providing a first memory location on output 826 of counter 820 to ROM 810. The data stored in the first memory location of ROM 810 is provided on output 620 to switches 780A–780P. Thus, the threshold voltage level after a HSP crossing by input signal 610 is specified by the data value stored in the first memory location of ROM 810. Counter 820 continues to provide this address on output 826 to ROM 810 while the output signal at node 608 remains HIGH.

When input signal 610 crosses the LSP, comparator 714 resets flip-flop 716 causing a transition from HIGH to LOW in the output 612 of flip-flop 716. The output signal ceases to reset counter 820 which therefore begins to sequentially address ROM 810 at a rate determined by divide-by-N counter 752 and oscillator signal 618. Counter 820 increments the address provided on output 826 of counter 820 to ROM 810 stopping when it reaches the stop value 824 unless input signal 610 crosses the HSP first. Once counter 820 reaches stop value 824, it continues to provide to the last location of ROM 810 on output 826 until the output signal at node 608 resets counter 820 again. The voltage pattern provided by ROM 810 on output 620 controls switches 780A–780P which connect and disconnect current sources 772–778 to resistor 788. In this manner, digital codes stored in ROM 810 control the amplitude pattern of threshold voltage $V_{TH}$ of the HSP.

Figure 1A:
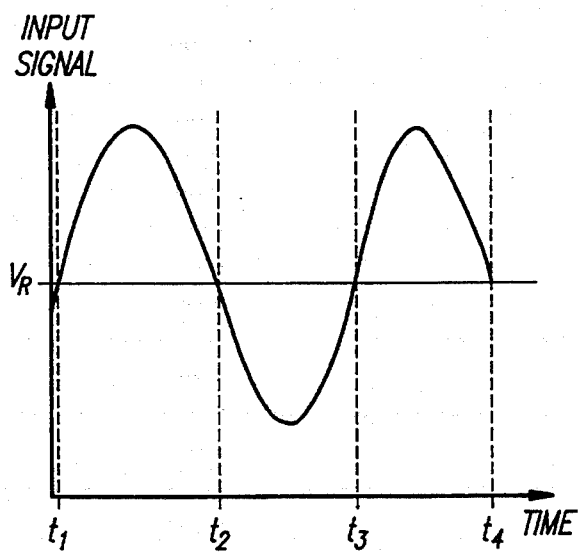
FIGS. 1A–1F are relative timing diagrams illustrating the relationship between the threshold crossings of input signals and the resulting output signal of a threshold detector having transitions according to the input signals.
Figure 1B:
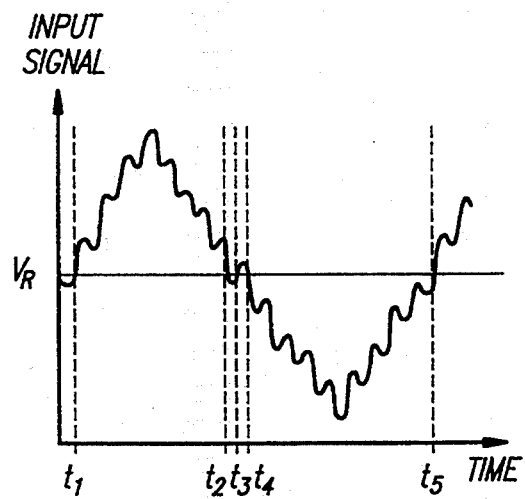
Figure 1C:
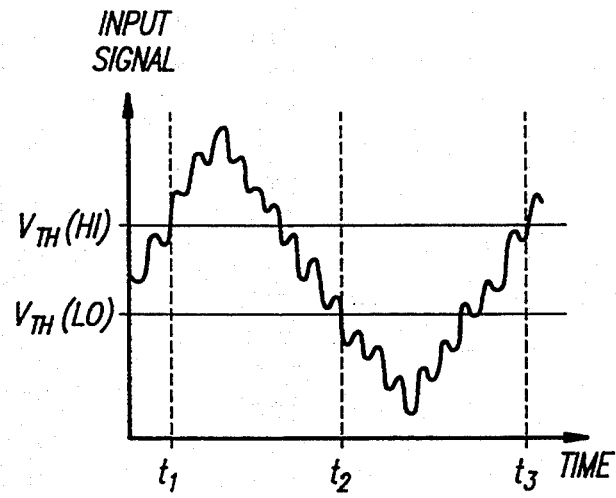
Figure 1D:
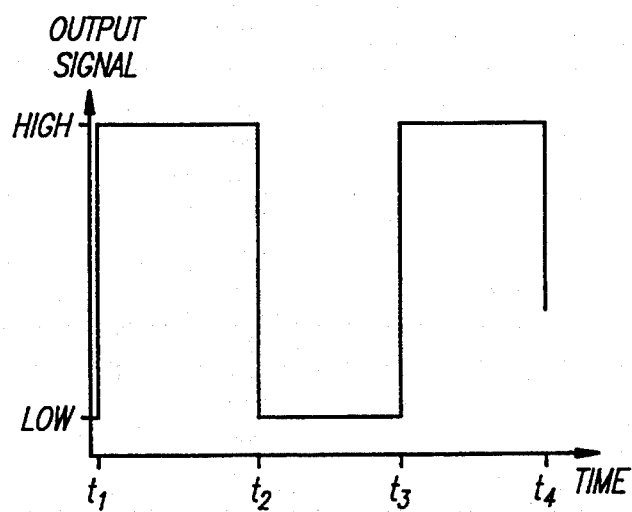
Figure 1E:
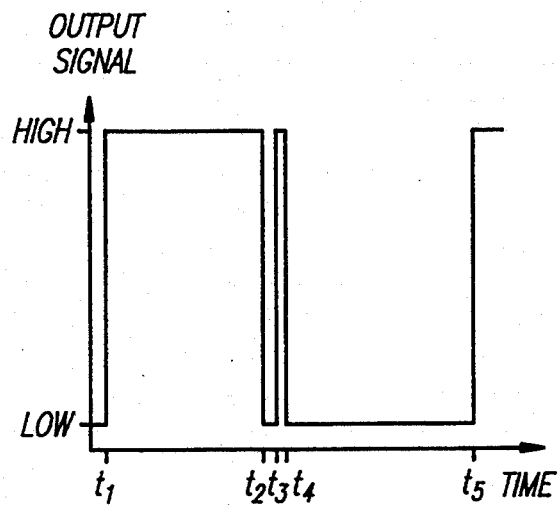
Figure 1F:
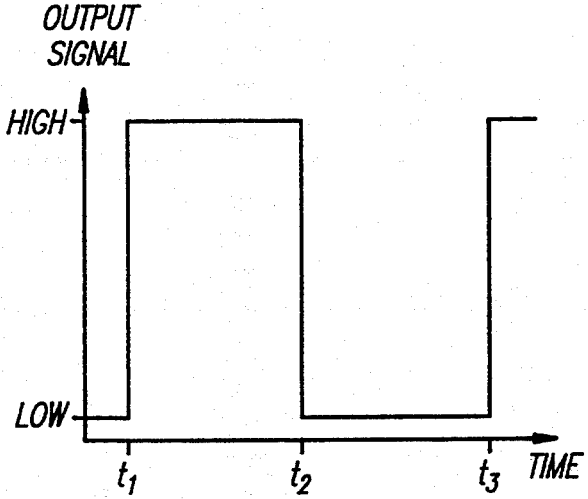
Figure 2A:
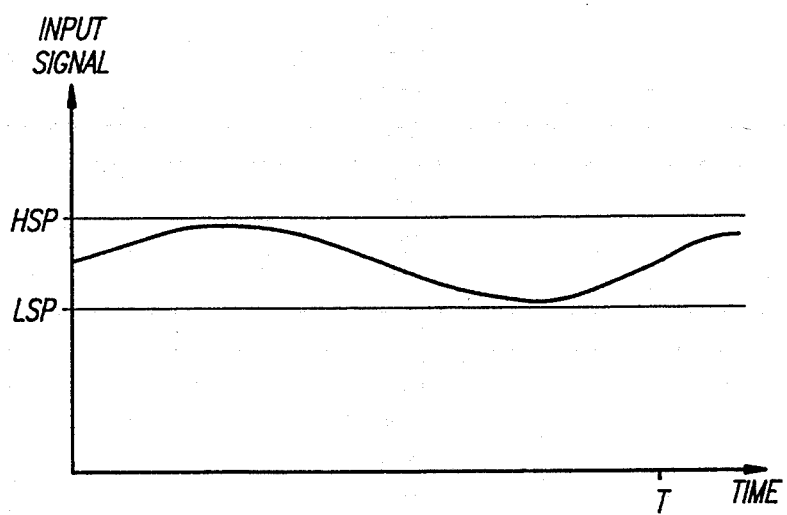
FIGS. 2A–2C are diagrams illustrating the relationship between two fixed hysteresis levels and input signals having amplitudes and noise which vary according to the frequency of the input signal.
Figure 2B:
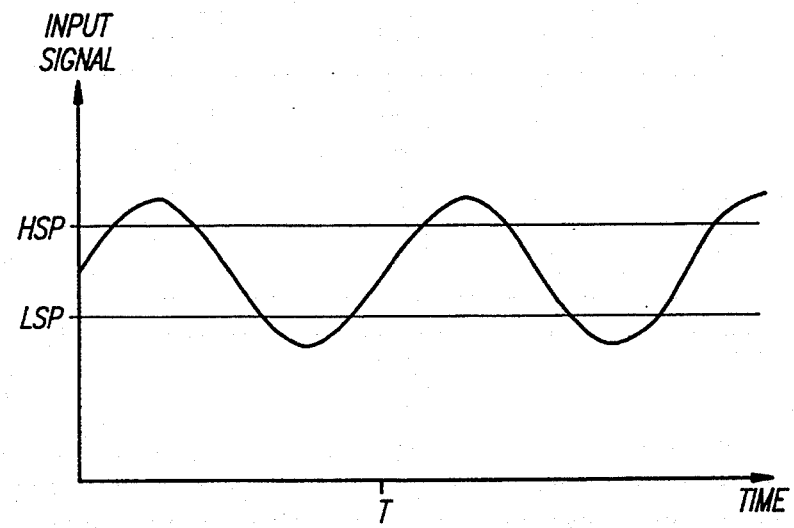
Figure 2C:
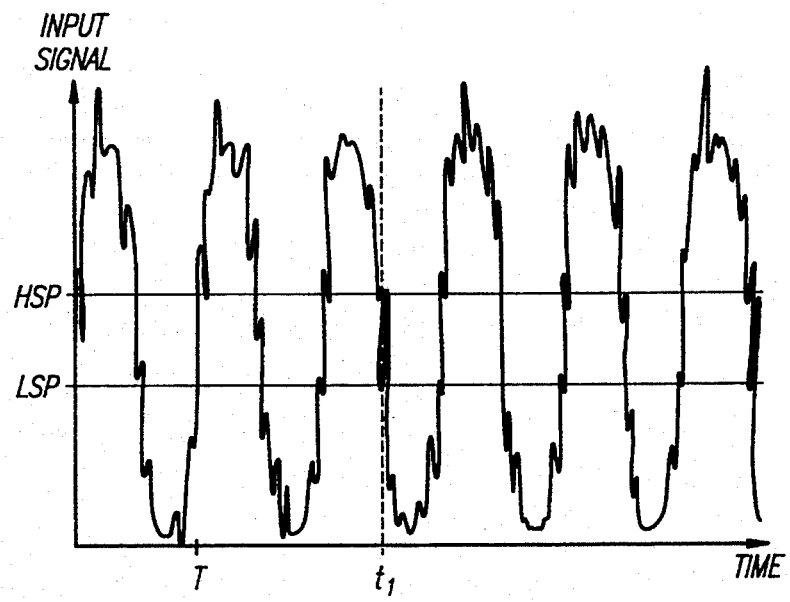
Figure 3:
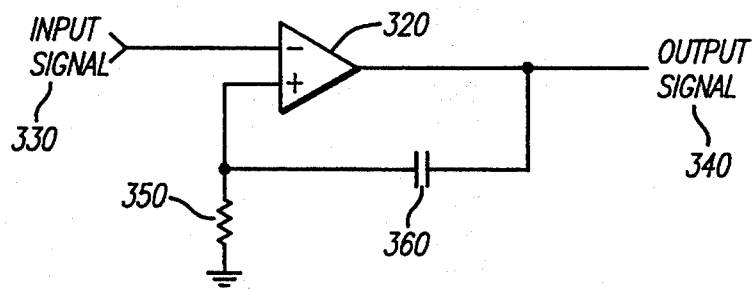
FIG. 3 is a schematic diagram of a prior art threshold detector.
Figure 4A:
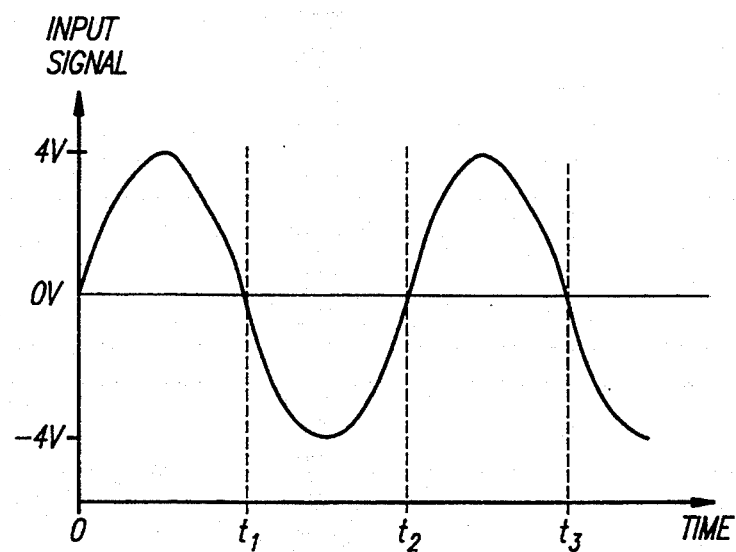
FIGS. 4A–4B are relative timing diagrams illustrating signals related to the prior art threshold detector shown in FIG. 3.
Figure 4B:
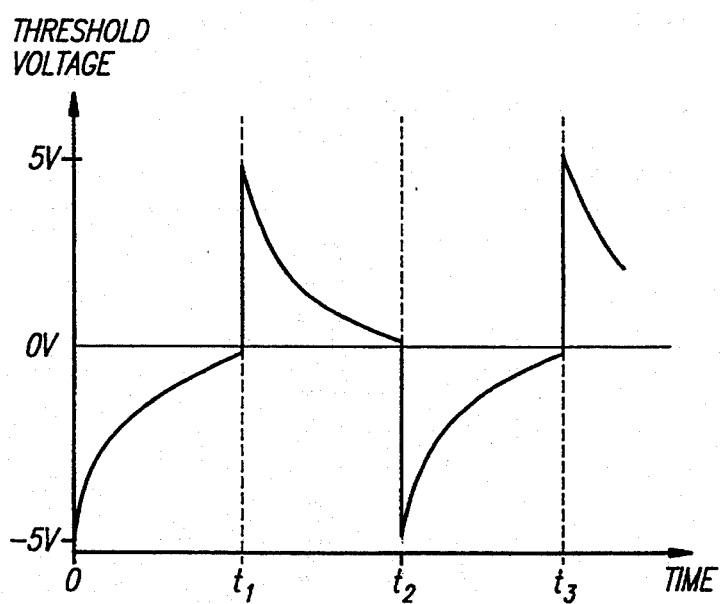
Figure 5:
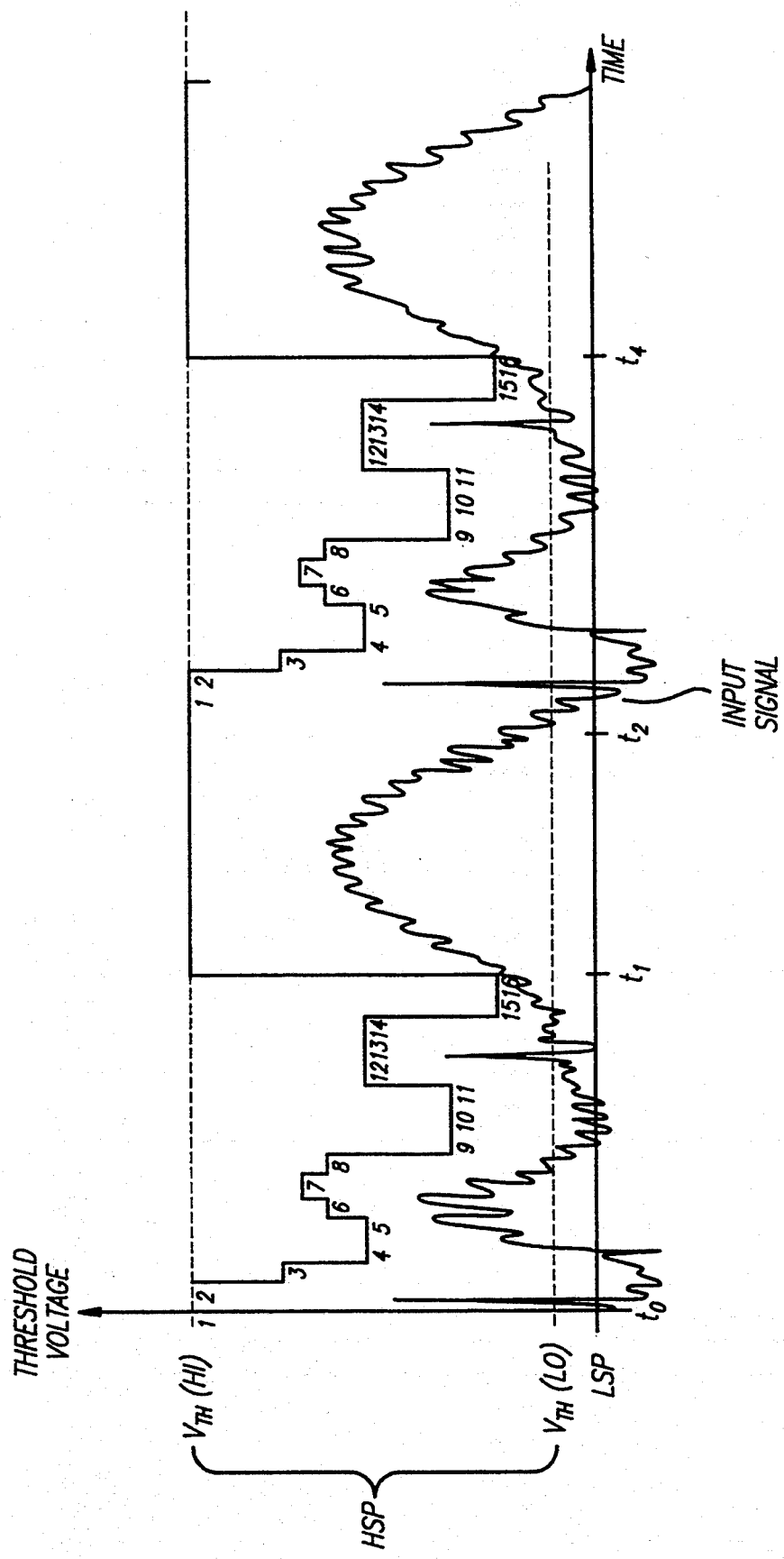
FIG. 5 is a diagram illustrating a programmable hysteresis pattern provided by the alternate embodiment of the present invention.

A threshold voltage pattern stored in ROM 810 is illustrated in FIG. 5 to demonstrate this advantage of the present invention. The diagram illustrates a threshold pattern for the HSP according to the threshold crossings of the HSP and LSP by an input signal 610. Initially, the HSP is at its maximum value $V_{TH}$(HI). At time $t_0$, the input signal 610 including noise crosses the LSP causing counter 820 to provide addresses on output 826 to ROM 810 at a rate governed by the output 760 of divide-by-N counter 752. During the first and second clock interval provided by divide-by-N counter 752, the output 620 of ROM 810 causes switches 780A–780P to close, thereby, producing a maximum threshold voltage $V_{TH}$ (HI) for the HSP. Because HSP remains at $V_{TH}$ (HI) during this time interval, a transient known a priori to occur in a given interval of the period of input signal 610 is prevented from erroneously crossing the HSP.

During the third clock interval, counter 820 addresses a third memory location in ROM 810. The data stored in this location is provided on output 620, thereby, turning off three of switches 780A–780P thereby causing the HSP to drop three incremental voltage levels. In this manner, the threshold voltage pattern of the HSP shown in FIG. 5 is generated. During clock intervals 12, 13 and 14, the threshold voltage of the HSP increases to a level three incremental levels above that of interval 11 in order to prevent a periodic transient from crossing the HSP. At time $t_1$, the input signal crosses the HSP causing the output 612 of flip-flop 716 to go HIGH, thereby, setting the HSP to $V_{TH}$ (HI). The threshold pattern of the HSP can be programmed to have any one of the sixteen possible voltage levels produced by current sources 770A–770P and resistor R1 in any given interval of the hysteresis pattern. This is accomplished by storing appropriate digital values in appropriate addresses of ROM 810.

Thus, an apparatus and a method for providing dynamic hysteresis for threshold detection has been described.

We claim:

1. A method of providing programmable hysteresis comprising the steps of:

providing an input signal and a threshold level signal to a comparator and comparing said input signal to a current level of said threshold level signal;

setting said threshold level signal to a first level when an input signal exceeds said current level of said threshold level signal;

providing a threshold level signal profile to a threshold level signal generator, wherein said threshold signal level profile comprises a time dependent wave form;

outputting said threshold level signal from said threshold level signal generator, said current level of said threshold level signal having a current level determined by said threshold level signal profile.

2. The method of claim 1 wherein said threshold level signal generator comprises a digital logic block coupled to a digital to analog converter.

3. The method of claim 1 further including the step of maintaining said current level of said threshold level signal at a second value when a first time period elapses between detection of input signals exceeding said threshold level signal.

4. The method of claim 3 wherein said profile comprises a linear decay over time of said current level from said first value to said second value.

5. A circuit for providing programmable hysteresis comprising:

comparing means for comparing an input signal to a current level of a threshold level signal;

threshold level signal generating means for setting said threshold level signal to a first level when an input signal exceeds said current level of said threshold level signal;

means for providing a threshold level signal profile to said threshold level signal generating means, wherein said threshold signal level profile comprises a time dependent wave form;

means for outputting said threshold level signal from said threshold level signal generator, said current level of said threshold level signal having a current level determined by said threshold level signal profile.

6. The circuit of claim 5 wherein said threshold level signal generating means comprises a digital logic block coupled to a digital to analog converter.

7. The circuit of claim 5 further wherein said current level of said threshold level signal is maintained at a second value when a first time period elapses between detection of input signals exceeding said threshold level signal.

8. The circuit of claim 7 wherein said profile comprises a linear decay over time of said current level from said first value to said second value.

9. A method of providing programmable hysteresis comprising the steps of:
providing an input signal and a threshold level signal having a current level to a comparator;
comparing said input signal to said current level of said threshold level signal and providing a comparator output signal having a first output level when said input signal exceeds said current level and providing a comparator output signal having a second output level when said input signal does not exceed said current level;
providing said comparator output signal to a programmable threshold level signal generator;
outputting said threshold level signal at a first threshold level when said comparator output signal is at said first output level;
outputting said threshold level signal at a current level determined by a threshold level signal profile when said comparator output is at said second level, wherein said threshold signal level profile comprises a time dependent wave form.

10. The method of claim 9 further including the step of maintaining said current level of said threshold level signal at a second threshold level when a first time period elapses between detection of input signals exceeding said threshold level signal.

11. The method of claim 9 wherein said threshold level signal generator comprises a digital logic block coupled to a digital to analog converter.

12. The method of claim 9 wherein said profile comprises a linear decay over time of said current level from said first value to said second value.

13. A circuit for providing programmable hysteresis comprising:
a comparator coupled to an input signal and to a threshold level signal, said comparator outputting a comparator output signal at a first output level when said input signal exceeds said threshold level signal, said comparator outputting a comparator output signal at a second output level when said input signal does not exceed said threshold level signal;
a programmable threshold level signal generator coupled to said comparator output signal, said threshold level signal generator outputting a threshold level signal having a first threshold level when said comparator output signal is at said first output level;
said threshold level signal generator outputting a threshold level signal having a current threshold level determined by a threshold level signal profile when said comparator output is at said second level, wherein said threshold signal level profile comprises a time dependent wave form.

14. The circuit of claim 13 wherein said threshold level signal generator comprises a digital logic block coupled to a digital to analog converter.

15. The circuit of claim 13 wherein said current level of said threshold level signal is maintained at a second threshold value when a first time period elapses between detection of input signals exceeding said threshold level signal.

16. The circuit of claim 15 wherein said profile comprises a linear decay over time of said current level from said first value to said second value.

17. A method of providing programmable hysteresis comprising the steps of:
providing an input signal and a threshold level signal to a comparator and comparing said input signal to a current level of said threshold level signal;
setting said threshold level signal to a first level when an input signal exceeds said current level of said threshold level signal;
providing a threshold level signal profile to a threshold level signal generator;
outputting said threshold level signal from said threshold level signal generator, said current level of said threshold level signal having a current level determined by said threshold level signal profile;
maintaining said current level of said threshold level signal at a second value when a first time period elapses between detection of input signals exceeding said threshold level signal, said profile comprises a linear decay over time of said current level from said first value to said second value.

18. The method of claim 17 wherein said threshold level signal generator comprises a digital logic block coupled to a digital to analog converter.

19. A circuit for providing programmable hysteresis comprising:
comparing means for comparing an input signal to a current level of a threshold level signal;
threshold level signal generating means for setting said threshold level signal to a first level when an input signal exceeds said current level of said threshold level signal;
means for providing a threshold level signal profile to said threshold level signal generating means;
means for outputting said threshold level signal from said threshold level signal generator, said current level of said threshold level signal having a current level determined by said threshold level signal profile;
said current level of said threshold level signal is maintained at a second value when a first time period elapses between detection of input signals exceeding said threshold level signal, said profile comprises a linear decay over time of said current level from said first value to said second value.

20. The circuit of claim 19 wherein said threshold level signal generating means comprises a digital logic block coupled to a digital to analog converter.

21. A method of providing programmable hysteresis comprising the steps of:
providing an input signal and a threshold level signal having a current level to a comparator;
comparing said input signal to said current level of said threshold level signal and providing a comparator output signal having a first output level when said input signal exceeds said current level and providing a comparator output signal having a second output level when said input signal does not exceed said current level;

providing said comparator output signal to a programmable threshold level signal generator;

outputting said threshold level signal at a first threshold level when said comparator output signal is at said first output level;

outputting said threshold level signal at a current level determined by a threshold level signal profile when said comparator output is at said second level, said profile comprises a linear decay over time of said current level from said first value to said second value.

22. The method of claim 21 further including the step of maintaining said current level of said threshold level signal at a second threshold level when a first time period elapses between detection of input signals exceeding said threshold level signal.

23. The method of claim 21 wherein said threshold level signal generator comprises a digital logic block coupled to a digital to analog converter.

24. A circuit for providing programmable hysteresis comprising:

a comparator coupled to an input signal and to a threshold level signal, said comparator outputting a comparator output signal at a first output level when said input signal exceeds said threshold level signal, said comparator outputting a comparator output signal at a second output level when said input signal does not exceed said threshold level signal;

a programmable threshold level signal generator coupled to said comparator output signal, said threshold level signal generator outputting a threshold level signal having a first threshold level when said comparator output signal is at said first output level;

said threshold level signal generator outputting a threshold level signal having a current threshold level determined by a threshold level signal profile when said comparator output is at said second level.

said current level of said threshold level signal is maintained at a second threshold value when a first time period elapses between detection of input signals exceeding said threshold level signal, said profile comprises a linear decay over time of said current level from said first value to said second value.

25. The circuit of claim 24 wherein said threshold level signal generator comprises a digital logic block coupled to a digital to analog converter.

* * * * *